United States Patent

Lin et al.

Patent Number: 6,100,014
Date of Patent: Aug. 8, 2000

[54] METHOD OF FORMING AN OPENING IN A DIELECTRIC LAYER THROUGH A PHOTORESIST LAYER WITH SILYLATED SIDEWALL SPACERS

[75] Inventors: Benjamin Szu-Min Lin, Chiayi; Kun-Chi Lin, Hsinchu, both of Taiwan

[73] Assignee: United Microelectronics Corp., Hsinchu, Taiwan

[21] Appl. No.: 09/199,883

[22] Filed: Nov. 24, 1998

[51] Int. Cl.[7] ................................................ G03F 7/00
[52] U.S. Cl. ...................... 430/314; 430/317; 430/324; 438/696
[58] Field of Search ..................................... 430/312, 313, 430/314, 317, 324, 325, 326; 438/696

[56] References Cited

U.S. PATENT DOCUMENTS

| | | | |
|---|---|---|---|
| 4,803,181 | 2/1989 | Buchmann et al. | 437/228 |
| 4,871,630 | 10/1989 | Giammarco et al. | 430/14 |
| 5,895,740 | 4/1999 | Chien et al. | 430/313 |
| 5,922,516 | 7/1999 | Yu et al. | 430/314 |
| 5,958,800 | 9/1999 | Yu et al. | 438/720 |

FOREIGN PATENT DOCUMENTS 5-013384 1/1993 Japan .
5-088375 4/1993 Japan .

*Primary Examiner*—John A. McPherson
*Attorney, Agent, or Firm*—Hickman Stephens Coleman & Hughes, LLP

[57] ABSTRACT

A semiconductor fabrication method is provided for forming an opening in a dielectric layer, which can help downsize the critical dimension of the resulting opening through the use of a photoresist layer with silylated sidewall spacers. By this method, the first step is to coat a base photoresist layer over the dielectric layer. Next, a photolithographic process is performed to remove a selected part of the base photoresist layer. Then, a conformational coating process is performed to coat a silylatable photoresist layer over the base photoresist layer to a controlled predefined thickness. Subsequently, a silylation process is performed on the silylatable photoresist layer so as to form a silylated photoresist layer over all the exposed surfaces of the base photoresist layer. After this, a first etching process is performed on the silylated photoresist layer, with the remaining portions of the silylated photoresist layer serving as silylated sidewall spacers on the base photoresist layer. Then, with the combined structure of the base photoresist layer and the overlying silylated sidewall spacers serving as mask, a second etching process is performed on the dielectric layer to etch away the unmasked part of the dielectric layer to form the intended opening in the dielectric layer.

11 Claims, 4 Drawing Sheets

METHOD OF FORMING AN OPENING IN A DIELECTRIC LAYER THROUGH A PHOTORESIST LAYER WITH SILYLATED SIDEWALL SPACERS

BACKGROUND OF THE INVENTION

1. Field of the Invention

This invention relates to semiconductor fabrication technology, and more particularly, to a method of forming an opening in a dielectric layer through a photoresist layer with silylated sidewall spacers, which can help reduce the critical dimension of the resulting opening.

2. Description of Related Art

High integration is the primary goal in the fabrication of integrated circuit (IC) devices. To achieve this goal, the various components in the integrated circuit are made with the smallest possible dimensions. Current semiconductor fabrication technology is able to fabricate integrated circuits clown to the 0.25 $\mu$m (micrometer) submicron level of integration. The photolithography is the key technology to the fabrication of MOS (metal-oxide semiconductor) related semiconductor structures, such as doped areas and contact openings. In submicron integration, the photolithographic transfer of a pattern from a mask is highly critical. Various methods, such as Optical Proximity Correction (OPC) and Phase Shift Mask (PSM), have been proposed to achieve high definition for the pattern transfer from a mask through photolithography onto a photoresist layer.

The OPC method is designed for the purpose of minimizing the deviation in the critical dimension of the transferred pattern due to a proximity effect. During the photolithographic process, the exposure light passing through the mask and striking on the photoresist layer is widely scattered due to dispersion.

Moreover, the exposure light transmitted through the photoresist layer reflects back from the substrate, thus causing interference that then causes double-exposure on the photoresist layer. As a result, the critical dimension of the transferred pattern from the mask is degraded. This undesired proximity effect is illustratively depicted in FIGS. 1 and 2.

In FIG. 1, the dashed rectangular area indicated by the reference numeral 10 is the intended pattern that is to be transferred from the mask onto the photoresist layer. Due to the proximity effect, however, the actually resulting pattern is shrunk in size to the shaded area indicated by the reference numeral 11. In FIG. 2, the dashed areas indicated by the reference numeral 20 are the intended patterns that are to be transferred from the mask onto the photoresist layer. Due to the proximity effect, however, the actually resulting pattern deviates from the intended positions and is inaccurately dimensioned, as are the shaded areas indicated by the reference numeral 21.

The OPC method solves the foregoing problem by first using computer software to compute the dimensional and positional deviations between the resulting patterns on the photoresist layer and the predefined patterns on the mask, and then using the data for correction of the size and position of the patterns on the mask. This increases the accuracy of transfer pattern definition. One drawback to the OPC method, however, is that it requires complex computing to obtain the needed corrections to the mask patterns and is therefore very difficult to implement.

FIG. 3A is a schematic diagram used to explain the principle of photolithography, whereas FIG. 3B is a schematic diagram used to explain the principle of the PSM method. These two diagrams are juxtaposed for the purpose of comparison. As shown in FIG. 3A, conventional photolithography utilizes a mask including a predefined pattern of chromium layers 100 coated over a crystal sheet 150. The chromium layers 100 represent the pattern that is to be transferred onto the photoresist layer (not shown). The chromium layers 100 are nontransparent to light. During the exposure process, exposure light 170 passes through the mask to illuminate the unmasked portions of the photoresist layer (not shown). The amplitude distribution of the exposure light 170 over the mask, the amplitude distribution of the exposure light 170 over the photoresist layer, and the intensity distribution of the exposure light 170 over the photoresist layer are respectively illustrated in the three graphs beneath.

As shown in FIG. 3B, by the PSM method, the mask is additionally provided with a phase-shifter layer 120 which can invert the phase of the light passing therethrough. The light passing through the phase-shifter layer 120 thus interferes in a destructive manner with the neighboring light that has not passed through the phase-shifter layer 120, thus making the transferred pattern sharply defined. The PSM method has the benefit of enhancing the definition of the transferred pattern without having to use shortwavelength exposure light. One drawback to the PSM method, however, is that the mask is quite difficult to manufacture and modify.

Although the foregoing OPC and PSM methods can help enhance the pattern definition in downsized fabrication of integrated circuits, they are still unsatisfactory to use due to complex and costly implementation.

SUMMARY OF THE INVENTION

It is therefore an objective of the present invention to provide a method for forming an opening in a dielectric layer, which can help downsize the critical dimension of the resulting opening through the use of a photoresist layer with silylated sidewall spacers.

In accordance with the foregoing and other objectives of the present invention, a new method is proposed for forming an opening in a dielectric layer. By the method of the invention, the first step is to form a base photoresist layer over the dielectric layer. Next, a photolithographic process is performed to remove a selected portion of the base photoresist layer that is laid directly over the portion of the dielectric layer where the intended opening is located. Then, a conformational coating process is performed to coat a silylatable photoresist layer over the base photoresist layer to a controlled, predefined thickness. Subsequently, a silylation process is performed on the silylatable photoresist layer so as to form a silylated photoresist layer over all the exposed surfaces of the base photoresist layer. After this, a first etching process is performed on the silylated photoresist layer, with the remaining part of the silylated photoresist layer serving as silylated sidewall spacers on the base photoresist layer. Then, with the combined structure of the base photoresist layer and the overlying silylated sidewall spacers serving as mask, a second etching process is performed on the dielectric layer to etch away the unmasked portion of the dielectric layer to form the intended opening in the dielectric layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention is disclosed in the following with reference to FIGS. 4A–4D.

Broadly speaking, the method of the invention is used to form a mask pattern for a photoresist layer in semiconductor fabrication, with the photoresist mask being subsequently used to define and form openings, such as contact openings or via openings, in a dielectric layer or in a damascene structure. In the following preferred embodiment, the method of the invention is used to form contact openings in a dielectric layer.

Figure 1:
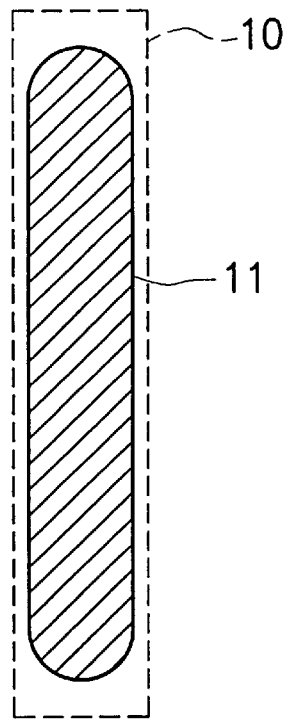
FIG. 1 is a schematic diagram used to depict the deviation between an actually transferred pattern and the intended pattern due to a proximity effect.
Figure 2:
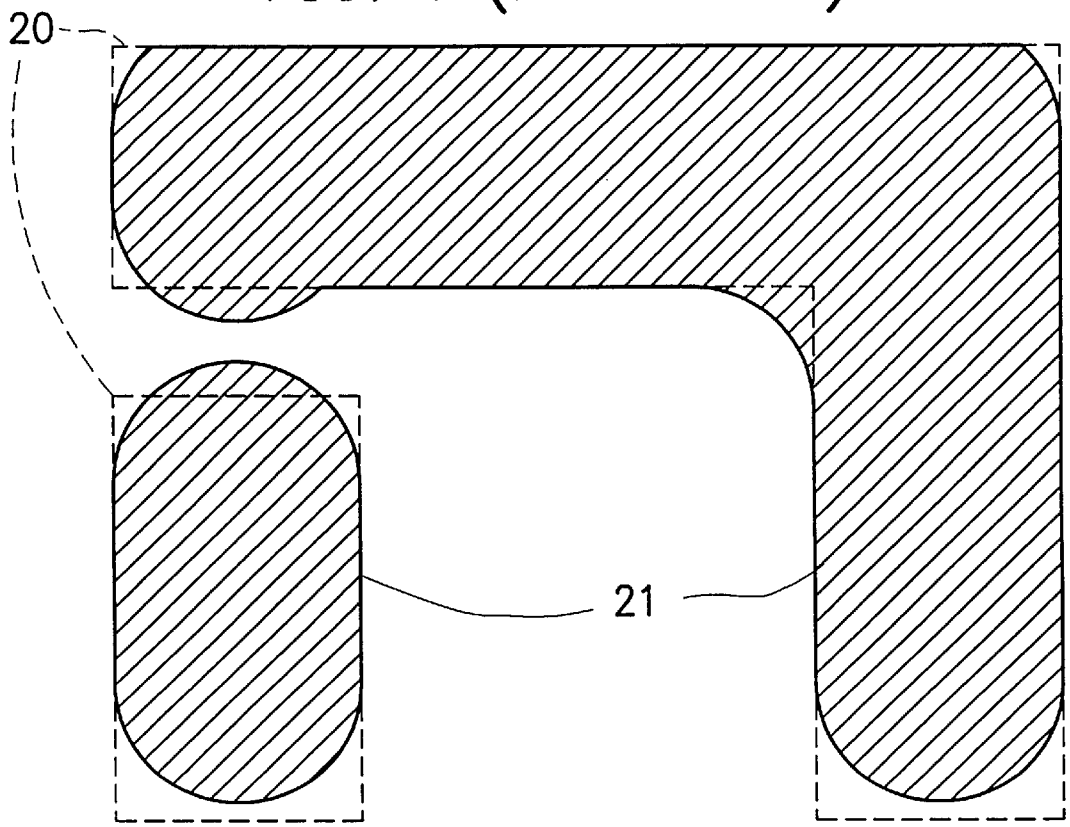
FIG. 2 is a schematic diagram used to depict the deviation between two actually transferred patterns and the intended patterns due to a proximity effect.
Figures 3A, 3B:
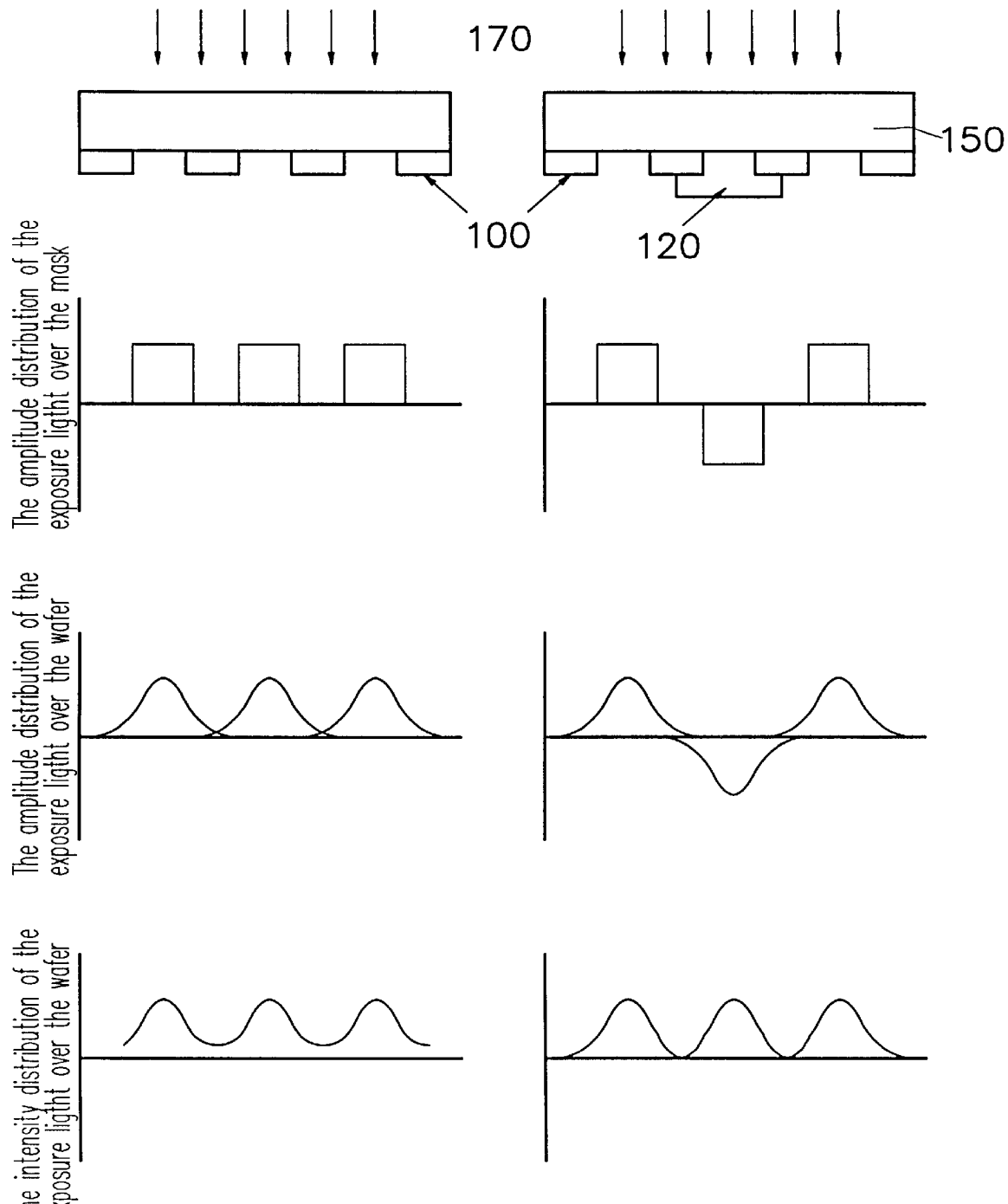
FIG. 3A is a schematic diagram used to explain the principle of photolithography.
FIG. 3B is a schematic diagram used to explain the principle of the PSM method.
Figure 4A:
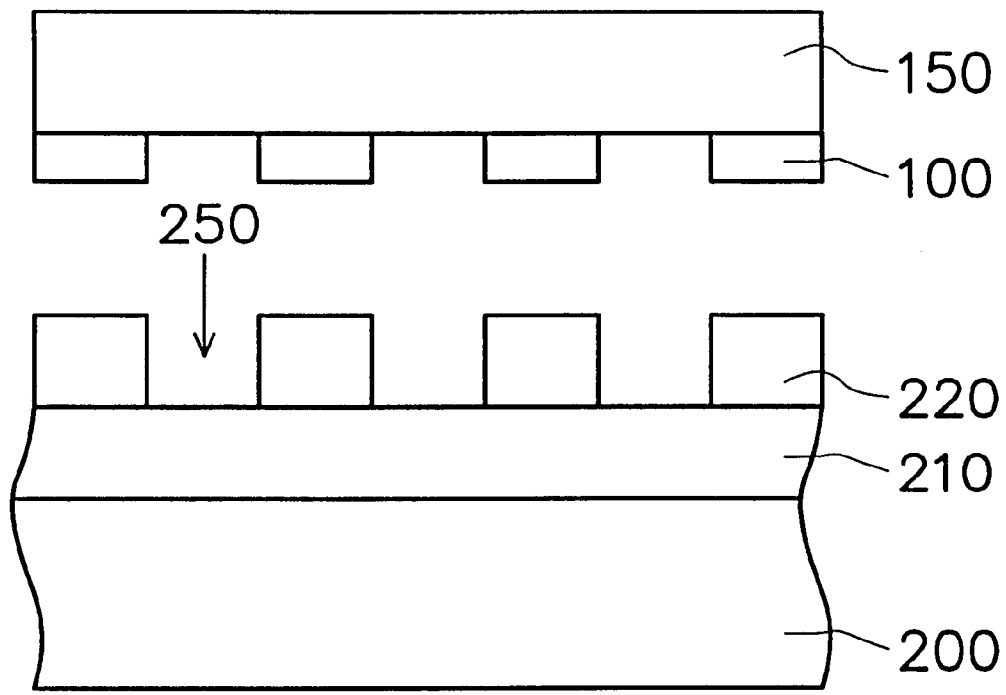
FIGS. 4A–4D are schematic, sectional diagrams used to depict the steps involved in the method of the invention for forming an opening in a dielectric layer.

Referring first to FIG. 4A, the method of the invention is applied on a semiconductor substrate 200 on which a dielectric layer 210, such as a layer of silicon dioxide, is already formed. The substrate 200 is already formed with doped regions (not shown) or metallization layers (not shown). A base photoresist layer 220 is then coated over the dielectric layer 210. Next, a photolithographic process is performed on the base photoresist layer 220 with a photomask that includes a predefined mask pattern of chromium layers 100 on a crystal sheet 150. The chromium layers 100 are nontransparent to the exposure light. Through the photolithographic process, the unmasked portions of the base photoresist layer 220 are removed to form openings 250 at selected locations.

Figure 4B:
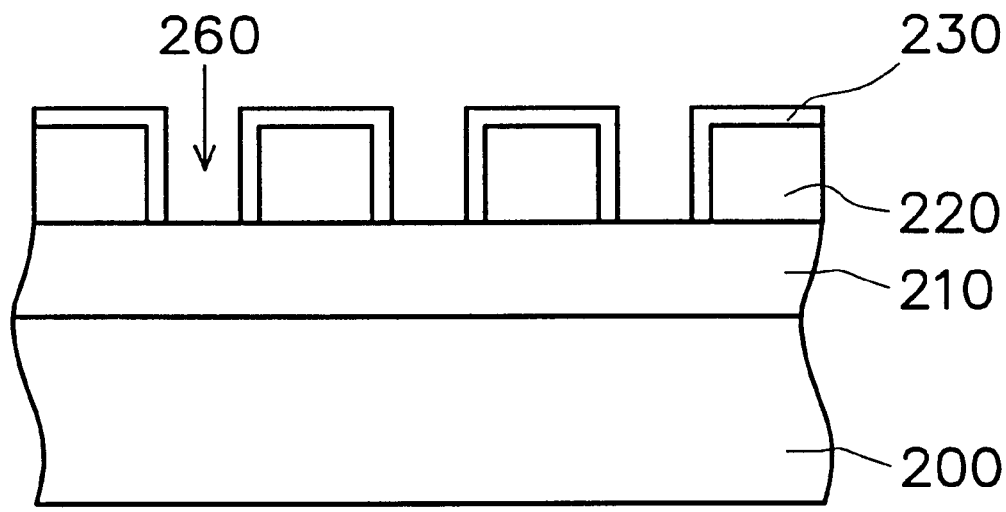

Referring further to FIG. 4B, in the subsequent step, a silylatable photoresist layer 230 is coated over all the exposed surfaces of the base photoresist layer 220 through a conformational coating process to a predefined controlled thickness that leaves open the previously formed openings 250 in the base photoresist layer 220 (the narrowed openings are here designated instead by the reference numeral 260 for distinguishing purpose). The silylatable photoresist layer 230 is then exposed to light and undergoes a silylation process with a suitable silylating agent, such as silicomethane ($SiH_4$). Alternatively, the silylatable photoresist layer 230 can be exposed to light before it is coated over the base photoresist layer 220 and undergoes the silylation process.

Figure 4C:
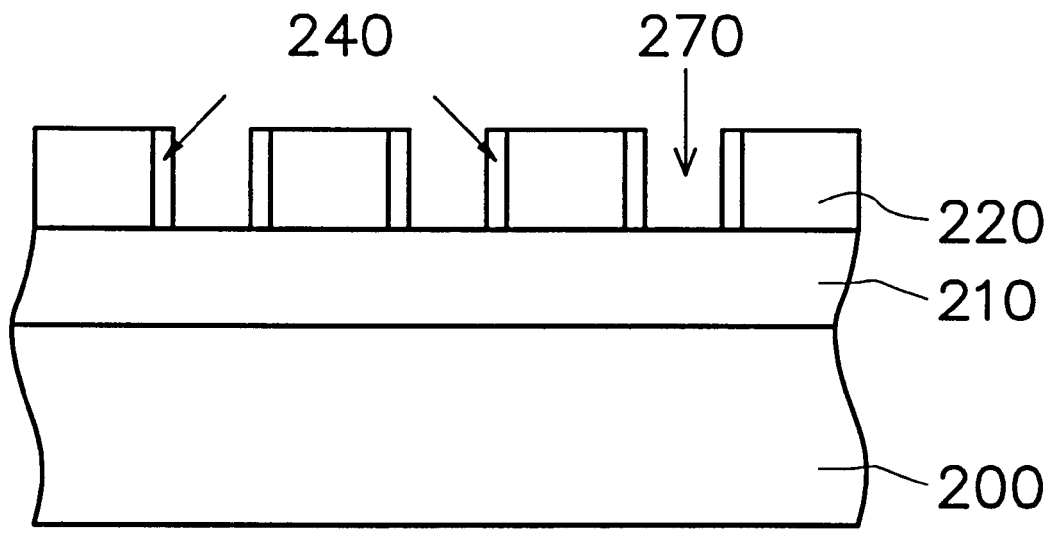

Referring next to FIG. 4C, in the subsequent step, an anisotropic etching process is performed on the silylatable photoresist layer 230 so as to remove those portions of the silylatable photoresist layer 230 that are laid directly over the topmost surfaces of the base photoresist layer 220. Through this process, the remaining portions of the silylatable photoresist layer 230 are left on the sidewalls of the previously formed openings 260 in the base photoresist layer 220 (the remaining portions of the silylatable photoresist layer 230 are here designated by the reference numeral 240 and are hereinafter referred to as silylated sidewall spacers). Additionally, the previously formed openings 260 are further narrowed (the further narrowed openings are here designated by the reference numeral 270 for distinguishing purposes).

Figure 4D:
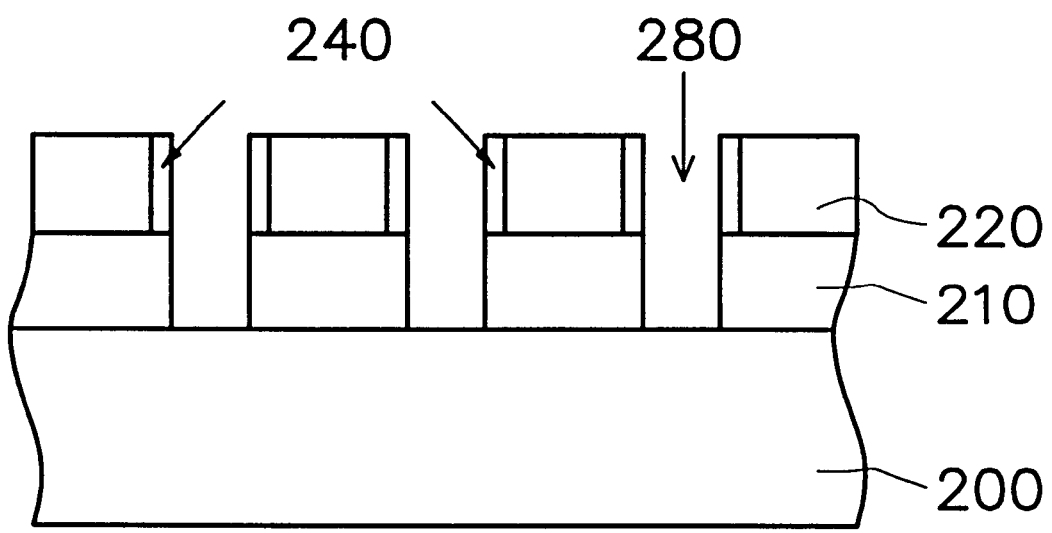

Referring next to FIG. 4D, in the subsequent step, a dry-etching process is performed on the wafer. During this process, the combined structure of the base photoresist layer 220 and the silylated sidewall spacers 240 serve as a mask for the etching process. The dry-etching process etches away all the unmasked portions of the dielectric layer 210 until the top surface of the substrate 200 is exposed, whereby a plurality of contact openings 280 is formed at predefined locations in the dielectric layer 210. After this, the combined structure of the base photoresist layer 220 and the silylated sidewall spacers 240 is entirely removed. This completes the forming of the contact openings 280 in the dielectric layer 210.

If the foregoing procedure is performed to form contact openings 280, the exposed portions of the substrate 200 are doped regions. If the openings are via openings, the exposed portions of the substrate 200 are metallization layers, and if openings in damascene structures, the exposed portions of the substrate 200 are either metallization layers or insulating layers. Broadly speaking, the method of invention can be used to form any kinds of opening through a dielectric layer in integrated circuit.

In conclusion, the method of the invention can help downsize the openings in the dielectric layer simply through the formation of silylated sidewall spacers on the sidewalls of the originally defined openings in the photoresist layer without having to make any modifications to the existing mask. Compared to the prior art, the method of the invention is undoubtedly easier and more cost-effective to implement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming an opening in a dielectric layer formed over a semiconductor substrate, comprising the steps of:

coating a base photoresist layer over the dielectric layer;

performing a photolithographic process to remove a selected part of the base photoresist layer lies directly over the part of the dielectric layer where the intended opening is located;

performing a conformational coating process to coat a silylatable photoresist layer over the base photoresist layer to a controlled predefined thickness;

performing a silylation process on the silylatable photoresist layer so as to form a silylated photoresist layer over all the exposed surfaces of the base photoresist layer;

performing a first etching process on the silylated photoresist layer, with the remaining part of the silylated photoresist layer serving as silylated sidewall spacers on the base photoresist layer;

with the combined structure of the base photoresist layer and the overlying silylated sidewall spacers serving as mask, performing a second etching process on the dielectric layer to etch away the unmasked part of the dielectric layer to form the intended opening in the dielectric layer; and removing the combined structure of the base photoresist layer and the overlying silylated sidewall spacers.

2. The method of claim 1, wherein the first etching process is a dry-etching process.

3. The method of claim 1, wherein the second etching process is a dry-etching process.

4. The method of claim 1, wherein the opening in the dielectric layer is a contact opening.

5. The method of claim 1, wherein the opening in the dielectric layer is a via opening.

6. The method of claim 1, wherein the opening in the dielectric layer is a damascene opening.

7. The method of claim 1, wherein the silylation process is performed with silicomethane serving as the silylating agent.

8. A method of defining a photoresist mask on a semiconductor wafer, comprising the steps of:

coating a base photoresist layer over the wafer;

performing a photolithographic process to remove a selected part of the base photoresist layer so as to form an opening in the base photoresist layer;

forming a silylated sidewall spacer to a controlled thickness on the sidewall of the opening in the base photoresist layer, wherein the combined structure of the base photoresist layer and the silylated sidewall spacer serve as the intended photoresist mask.

9. The method of claim 8, wherein the silylated sidewall spacer is formed by the steps of:

performing a conformational coating process to coat a silylatable photoresist layer over the base photoresist layer to a controlled predefined thickness;

performing a silylation process on the silylatable photoresist layer so as to form a silylated photoresist layer over all the exposed surfaces of the base photoresist layer; and performing an etching process on the silylated photoresist layer, with the remaining part of the silylated photoresist layer serving as the intended silylated sidewall spacer.

10. The method of claim 9, further comprising the step of:

exposing the silylatable photoresist layer to light.

11. The method of claim 10, wherein the silylation process is performed with silicomethane serving as the silylating agent.

* * * * *